US008100702B2

(12) United States Patent
Yu et al.

(10) Patent No.: US 8,100,702 B2
(45) Date of Patent: Jan. 24, 2012

(54) RECEPTACLE CONNECTOR

(75) Inventors: Wang-I Yu, Jhonghe (TW); Hung-Chi Tai, Jhonghe (TW); Chun-Hsien Wu, Jhonghe (TW); Yung-Chih Hung, Jhonghe (TW)

(73) Assignee: Alltop Electronics (Suzhou) Co., Ltd., Taicang, Jiangsu Province (CN)

( * ) Notice: Subject to any disclaimer, the term of this patent is extended or adjusted under 35 U.S.C. 154(b) by 142 days.

(21) Appl. No.: 12/714,641

(22) Filed: Mar. 1, 2010

(65) Prior Publication Data

US 2011/0092104 A1 Apr. 21, 2011

(30) Foreign Application Priority Data

Oct. 21, 2009 (CN) .......................... 2009 1 0208297

(51) Int. Cl.
*H01R 12/00* (2006.01)
*H05K 1/00* (2006.01)

(52) U.S. Cl. .......................................... 439/79; 439/676

(58) Field of Classification Search .................... 439/79, 439/676, 607.01, 701
See application file for complete search history.

(56) References Cited

U.S. PATENT DOCUMENTS 4,734,043 A * 3/1988 Emert et al. .................... 439/65
6,093,060 A 7/2000 Wiebking et al.

* cited by examiner

*Primary Examiner* — Javaid Nasri
(74) *Attorney, Agent, or Firm* — Sughrue Mion, PLLC

(57) ABSTRACT

A receptacle connector for receiving a complementary plug includes an insulative housing (100), a number of contacts (200) received in the housing, a metallic shell (300) partially covering the housing and a pair of fixing members (400) assembled between the housing and the shell. The housing has a pair of end walls (103) including a top wall and a bottom wall, a rear wall (104), a pair of side walls (102), and a receiving space (105) defined therebetween for receiving the complementary plug. The rear wall defines a number of receiving channels (113). The top wall defines a top surface (117) and a plurality of receiving slots (111) opened on the top surface. Each contact includes a retention portion (201), a contact portion (202) and a tail portion (205). The top wall forms a protrusion (112) protruded in each receiving slot, and each contact portion has a free end (204) abutting against the protrusion and being capable of moving in the receiving slot when the contact portion is engaged with and deflected by the complementary plug.

16 Claims, 5 Drawing Sheets

RECEPTACLE CONNECTOR

BACKGROUND OF THE INVENTION

1. Field of the Invention

The present invention is related to an electrical connector, and more particularly to a receptacle connector mounted on a printed circuit board for mating with a complementary plug.

2. Description of the Related Art

U.S. Pat. No. 6,093,060 discloses a conventional electrical connector used in signal transmission networks. The connector includes a housing having a front face and a cavity which is open through the front face for receiving a mating electrical connector. The housing has a terminal support shelf and a wall which is spaced from the terminal support shelf to define a slot between the terminal support shelf and the wall. The slot extends in a longitudinal direction from an upstream end which is open through a rear of the housing to a downstream end which is open to the cavity. The slot has a laterally extending width. The terminals extend longitudinally through the slot and are arranged side-by-side along the width of the slot. The forward ends of the terminals are bent backwards around the forward end of the terminal support shelf so that provide resilient contact portions which are engageable with terminals of a mating plug connector received in the cavity. However, such a terminal structure could not provide a more reliable connection after repeated insertions of the mating plug. In some instances, the backward bent contact end will be broken off from the rest of the terminal. Moreover, manufacture of these terminals requires a number of operations, thereby adding to manufacturing cost.

Hence, it is desired to provide a receptacle connector with improved contact structure to solve the above-described problems.

SUMMARY OF THE INVENTION

A receptacle connector in accordance with the present invention for receiving a complementary plug comprises an insulative housing, a plurality of contacts received in the insulative housing, a metallic shell partially covering the insulative housing and a pair of fixing members assembled between the insulative housing and the metallic shell. The insulative housing has a top wall, a bottom wall, a rear wall, a pair of side walls connecting the top and the bottom walls, and a receiving space defined therebetween for receiving the complementary plug. The rear wall defines a plurality of receiving channels extending therethrough. The top wall defines a top surface and a plurality of receiving slots opened on the top surface. Both the receiving channels and the receiving slots are communicating with the receiving space. Each contact comprises a retention portion fixed in the corresponding receiving channel, a contact portion extending into the receiving space from the retention portion, and a tail portion extending perpendicularly from the retention portion. The top wall forms a protrusion protruded in each receiving slot, and each contact portion has a free end abutting against the protrusion and being capable of moving in the receiving slot when the contact portion is engaged with and deflected by the complementary plug.

Other objects, advantages and novel features of the invention will become more apparent from the following detailed description when taken in conjunction with the accompanying drawings.

DETAILED DESCRIPTION OF THE PREFERRED EMBODIMENTS

Reference will now be made in the detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Figure 1:
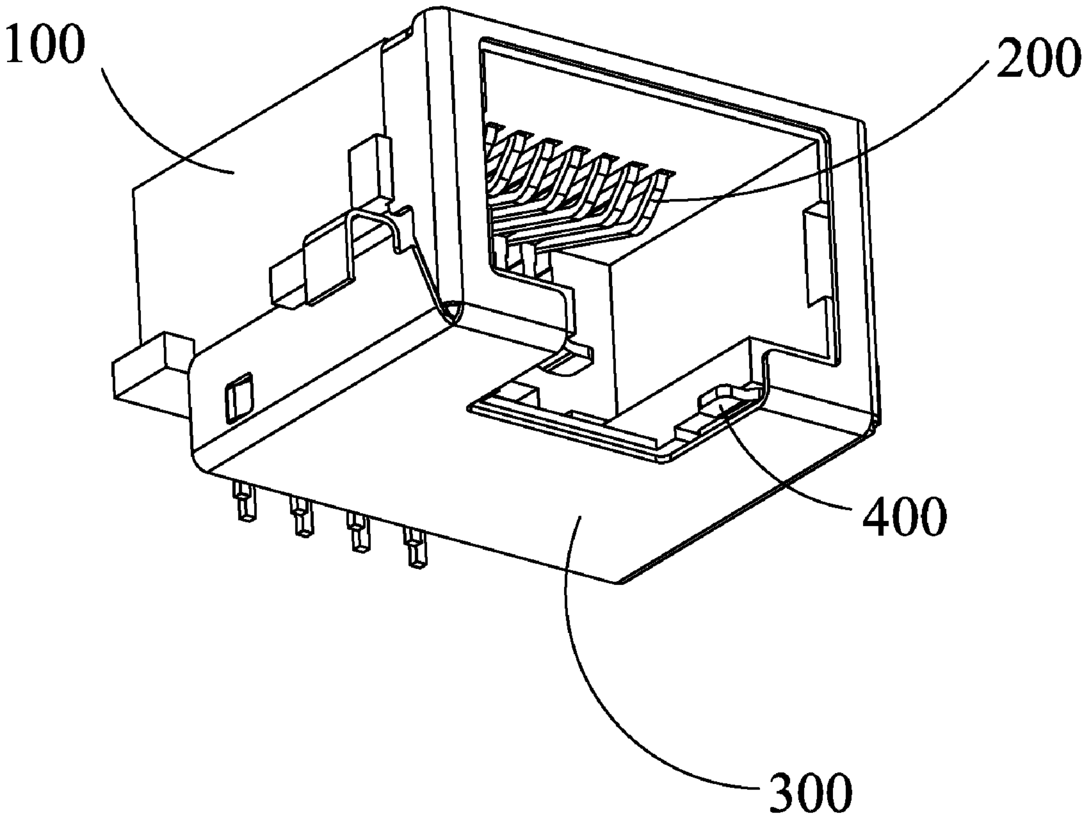
FIG. 1 is a perspective view of a receptacle connector in accordance with the present invention.
Figure 2:
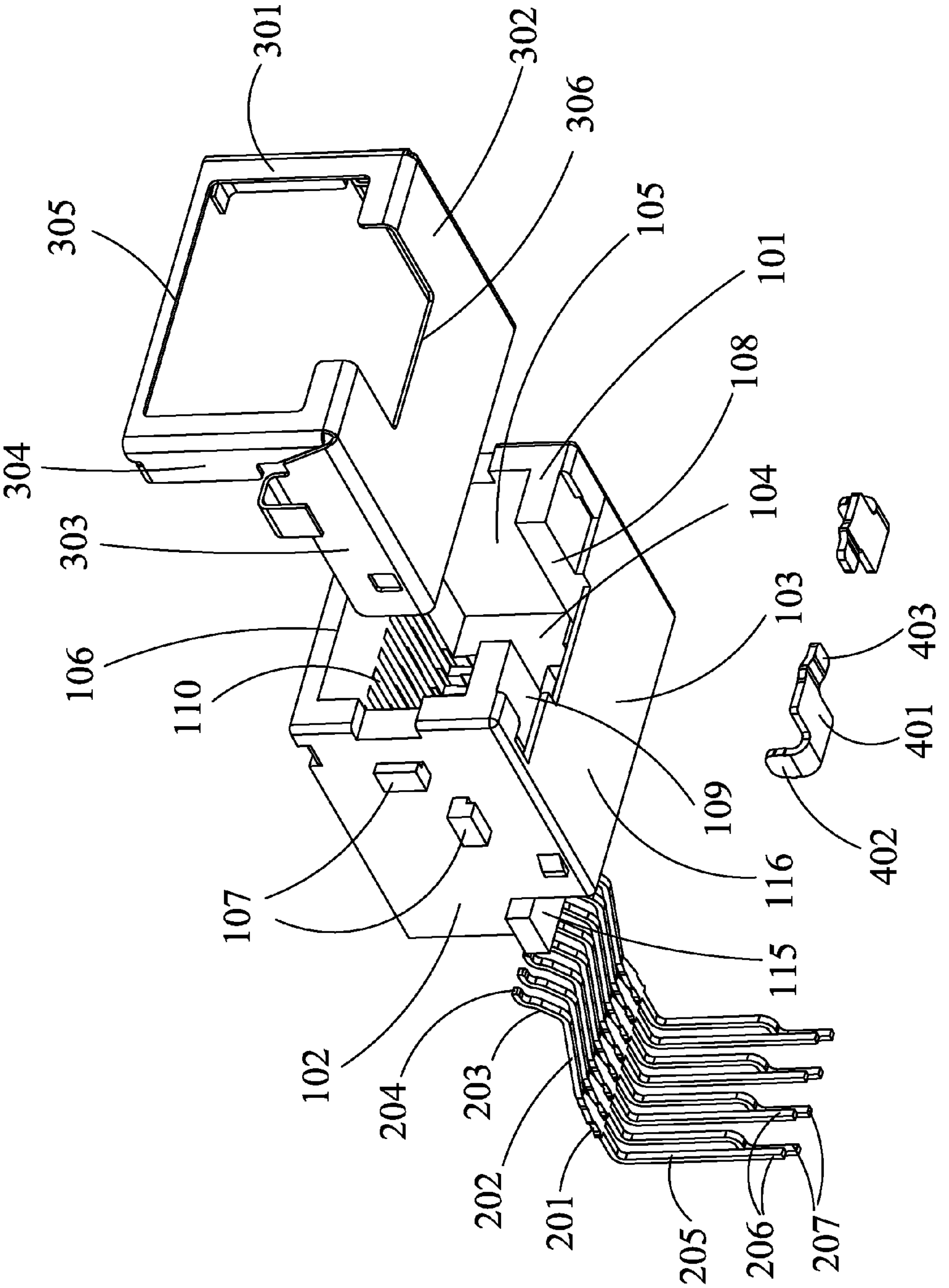
FIG. 2 is an exploded, perspective view of the receptacle connector shown in FIG. 1.
Figure 3:
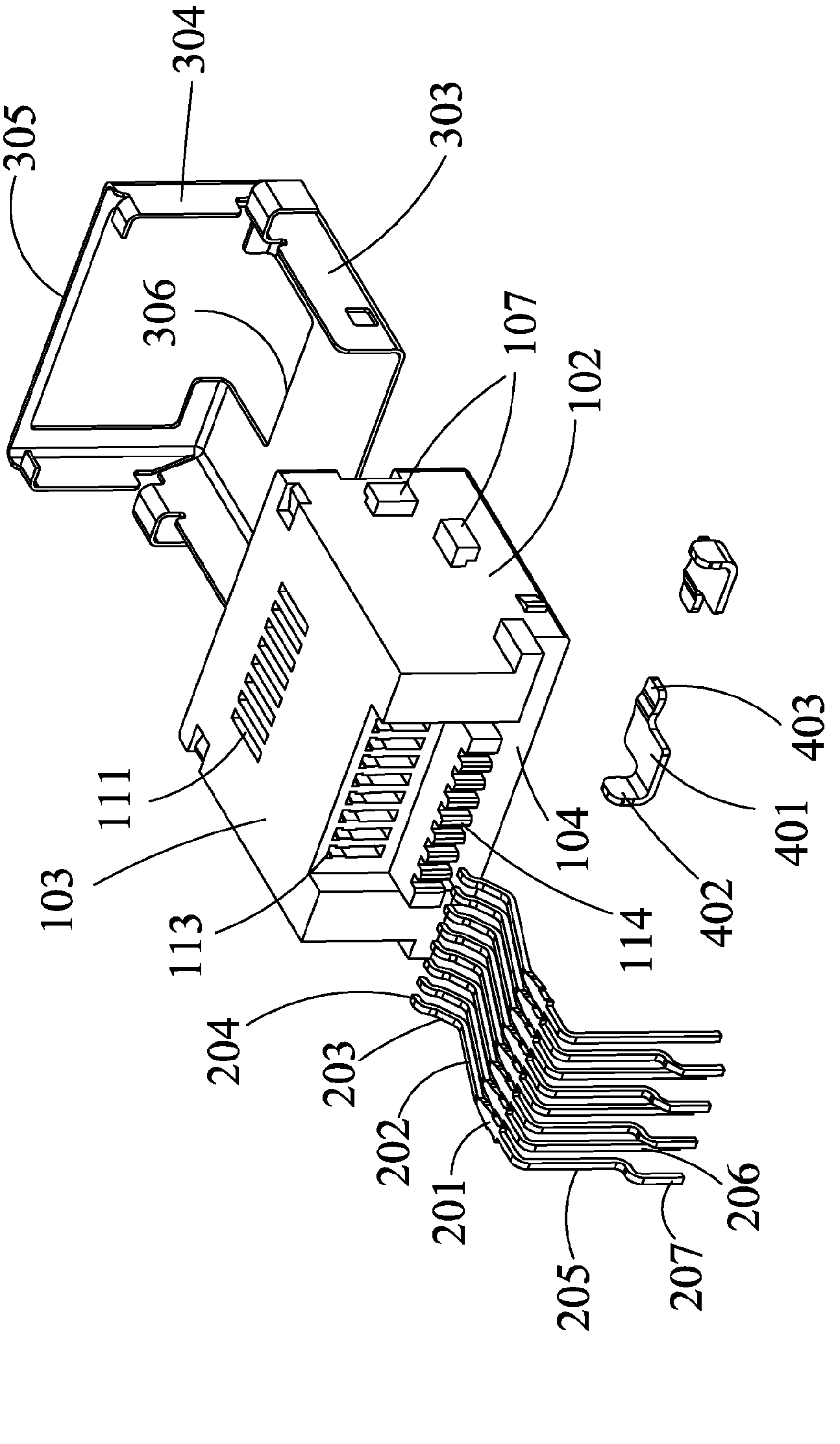
FIG. 3 is an exploded, perspective view of the receptacle connector shown in FIG. 1 while taken from a different aspect.

Referring to FIGS. 1-3, a receptacle connector in accordance with the present invention comprises an insulative housing 100, a plurality of contacts 200 received in the insulative housing 100, a metallic shell partially enclosing the insulative housing 100, and a pair of fixing members 400 assembled to the insulative housing 100.

The insulative housing 100 has a pair of end walls 103, a pair of side walls 102 extending between the pair of end walls 103, and a rear wall 104. A receiving space 105 is defined between the walls for receiving a complementary plug (not shown). As can be understood, one of the two end walls 103 is a top wall and the other end wall 103 is a bottom wall. The top wall 103 defines a plurality of receiving slots 111 and a plurality of protrusions 112 each protruded into corresponding receiving slot 111. The receiving slots 111 communicates with the receiving space 105 and opened to a top surface 117 of the top wall 103. The rear wall 104 defines a plurality of receiving channels 113 extending therethrough which is configured in T-shaped in this preferred embodiment. The receiving channels 113 communicates with the receiving space 105. The bottom wall 103 defines a cutout 108 opened to a front face or a mating face 101 for engaging with corresponding portion of the complementary plug.

In the preferred embodiment, the receptacle connector is mounted to a cutout of a printed circuit board (not shown). In order to reduce the height of the connector above the printed circuit board, the insulative housing 100 of the present invention provides a mounting face 115 formed between the top surface 117 and a bottom surface 116 of the bottom wall 103 with respect to the printed circuit board. The insulative housing 100 forms a row of ribs 114 projecting from the rear wall 104 and a plurality of blocks 107 on the side walls 102.

Figure 4:
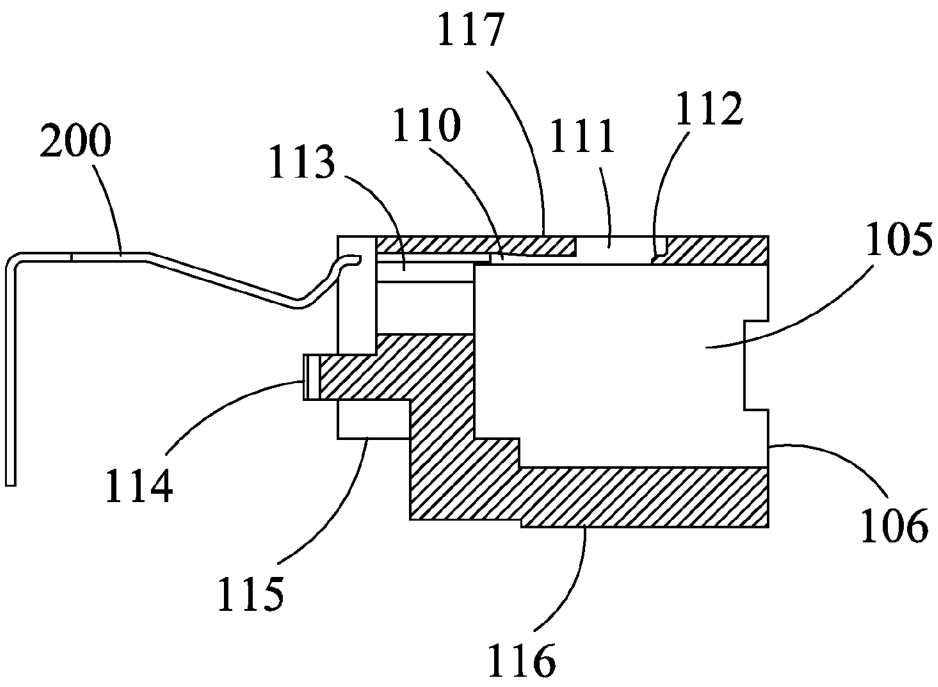
FIG. 4 is a cross-sectional view of an insulative housing of the receptacle connector shown in FIG. 1 before insertion of a contact.
Figure 5:
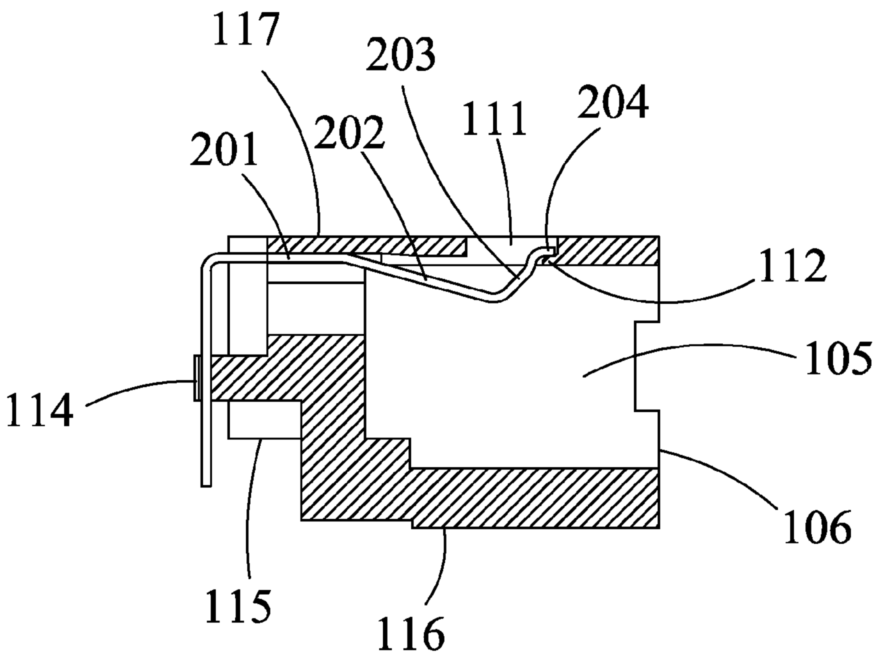
FIG. 5 is a view similar to FIG. 4 with the contact inserted into the insulative housing.
Figure 6:
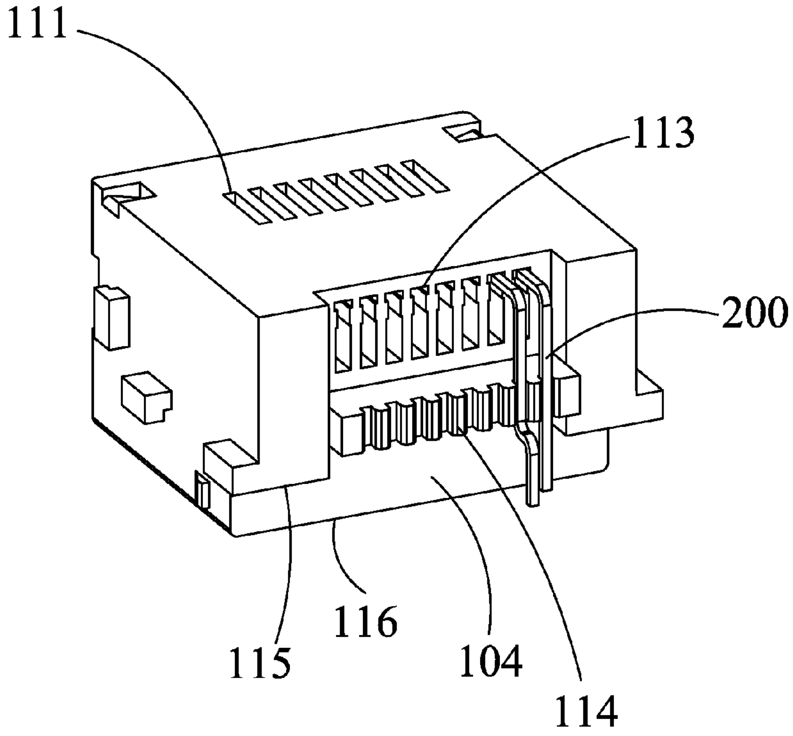
FIG. 6 is a rear perspective view of the insulative housing with exemplary contacts received thereon.

Each contact 200 comprises a retention portion 201 retained in corresponding receiving channel 113, a contact portion 202 extending forwardly from the retention portion 201, and a tail portion 205 extending perpendicularly from the retention portion to the printed circuit board. The contact portion 202 has a curved portion 203 with a free end 204 formed thereon. The free end 204 abuts against the protrusion 112 of the top wall 103 and the curved portion 203 is bent towards the receiving space 105. When the complementary plug is inserted into the receiving space 105, the curved portion 203 is driven and deflected with the free end 204 moving in the receiving slot 111 and being away from the protrusion 112. As can be readily seen, the curved portion 203 provides a reliable contact between the contact 200 and the complementary plug. Each tail portion 205 includes a solder leg 206, 207 connecting to the printed circuit board. In this preferred embodiment, the solder legs are arranged into two groups 206, 207. The tail portions 205 are fixed up or organized by the plurality of ribs 114. Referring to FIGS. 2-3 together with FIGS. 4-6, in the present embodiment, the top wall 103 also defines a plurality of passageways 110 connecting the receiving channels 113 to the receiving space 105 and the receiving slots 111.

Turn to FIGS. 2-3, the metallic shell 300 includes a front section 301 and a rear section 302 extending rearwards from a lower side edge of the front section 301. In this preferred embodiment, the metallic shell 300 is stamped from one piece of metal sheet. As can be understood, the metallic shell 300 can also be formed by different pieces of sheets. The front section 301 defines a front opening 305 communicating with the receiving space 105 through the front opening 106 of the receiving space 105 and the front section 301 covers the mating face 101 of the insulative housing 100. The rear section 302 defines a cutout 306 communicating with the front opening 305. The cutout 306 is consistence with the shape of the cutout 108 of the bottom wall 103. A plurality of ears 303, 304 are formed on the front section 301 and the rear section 302. The plurality of ears 303, 304 are employed to engage with the blocks 107 of the insulative housing 100 to thereby securing the metallic shell 300 on the insulative housing 100.

The two fixing members 400 are formed to protect the inserted complementary plug from broken off from the insulating housing 100. Each fixing member 400 has a fixing leg 402 retained in a slit (not labeled), a fixing arm 403 located in a recess 109 of the bottom wall 103 and extending into the cutout 108, and a planar, base portion 401 connecting between the fixing leg 402 and the fixing arm 403.

Figure 7:
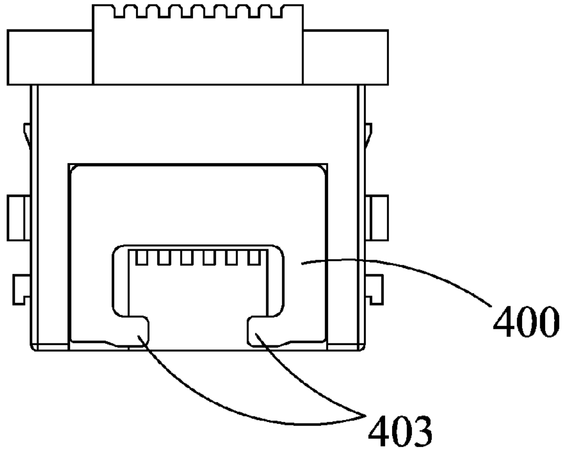
FIG. 7 is bottom side view showing the receptacle connector using one piece of fixing member.
Figure 8:
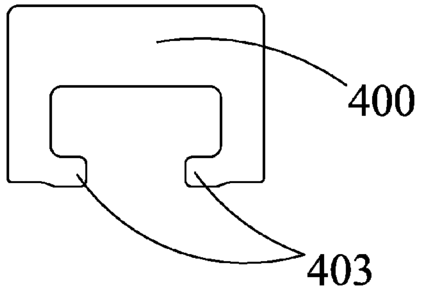
FIG. 8 is a bottom side view of the one piece of fixing member shown in FIG. 7.

In another embodiment, the fixing member can be formed in one piece. Referring to FIGS. 7-8, similar to the first embodiment of the fixing member, the one piece fixing member 400 of this embodiment, is sandwiched between the bottom wall 103 and the rear section 302 of the shell with two fixing arms 403 are opposite to each other and connected by the elongated planar, base portion.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. A receptacle connector for receiving a complementary plug, comprising:

an insulative housing having a top wall, a bottom wall, a rear wall, a pair of side walls connecting the top and the bottom walls, and a receiving space defined therebetween for receiving the complementary plug, the rear wall defining a plurality of receiving channels extending therethrough, the top wall defining a top surface and a plurality of receiving slots opened on said top surface, both the receiving channels and the receiving slots communicating with the receiving space; and a plurality of contacts assembled to the insulative housing, each contact comprising a retention portion fixed in the corresponding receiving channel, a contact portion extending into the receiving space from the retention portion, and a tail portion extending perpendicularly from the retention portion;

wherein the top wall forms a protrusion protruded in each receiving slot, and each contact portion having a free end abutting against said protrusion and being capable of moving in said receiving slot when the contact portion is engaged with and deflected by the complementary plug.

2. The receptacle connector as claimed in claim 1, wherein the contact portion has a curved portion bent towards the receiving space and connecting to the free end.

3. The receptacle connector as claimed in claim 2, further comprising a metallic shell partially enclosing said insulative housing.

4. The receptacle connector as claimed in claim 3, wherein the metallic shell comprises a front section and a rear section perpendicularly connecting to the front section.

5. The receptacle connector as claimed in claim 4, wherein the insulative housing defining a mating face in the front thereof for receiving the complementary plug and a bottom surface on the bottom wall.

6. The receptacle connector as claimed in claim 5, wherein the front section of the metallic shell covers the mating face of the insulative housing and the rear section covers the bottom surface of the insulative housing.

7. The receptacle connector as claimed in claim 5, further comprising at least one fixing members assembled between the bottom wall and the metallic shell.

8. The receptacle connector as claimed in claim 7, wherein the bottom wall defines a recess opened to the mating face and the at least one fixing member has a fixing arm extending into the recess.

9. The receptacle connector as claimed in claim 8, wherein the bottom wall defines a slit and the at least one fixing member includes a leg inserting into the slit to thereby retaining the at least one fixing member on said insulative housing.

10. The receptacle connector as claimed in claim 5, wherein the insulative housing defines a mounting face located between the top surface and the bottom surface with respect to a printed circuit board on which the receptacle connector is mounted.

11. The receptacle connector as claimed in claim 4, wherein the metallic shell provides a plurality of ears extending from the front section and the rear section, respectively.

12. The receptacle connector as claimed in claim 11, wherein the insulative housing forms a plurality of blocks on the side walls to correspondingly engaging with the ears of the metallic shell to thereby securing the metallic shell on said insulative housing.

13. The receptacle connector as claimed in claim 3, wherein the bottom wall of the insulative housing defines a cutout and the metallic shell defines a cutout consistence with the cutout of the bottom wall.

14. The receptacle connector as claimed in claim 1, wherein the insulative housing provides a plurality of ribs on the rear wall and the tail portions of the contacts are correspondingly retained between the plurality of ribs.

15. The receptacle connector as claimed in claim 1, wherein the top wall of the insulative housing defines a plurality of passageways communicating the receiving channels and the receiving slots, respectively.

16. The receptacle connector as claimed in claim 1, wherein the receiving channel is configured in T-shaped.

* * * * *